US007211135B2

(12) United States Patent
Berkei et al.

(10) Patent No.: US 7,211,135 B2
(45) Date of Patent: May 1, 2007

(54) WRITABLE AND PRINTABLE COLLOIDAL GOLD SOLUTION

(75) Inventors: Michael Berkei, Haltern am See (DE); Maren Korsten, Hamburg (DE); Fernando Ibarra, Hamburg (DE); Stephan Haubold, Hamburg (DE)

(73) Assignee: nanogate coating systems GmbH, Saarbrucken, Deutschland (DE)

( * ) Notice: Subject to any disclaimer, the term of this patent is extended or adjusted under 35 U.S.C. 154(b) by 60 days.

(21) Appl. No.: 10/801,763

(22) Filed: Mar. 16, 2004

(65) Prior Publication Data

US 2005/0204956 A1    Sep. 22, 2005

(51) Int. Cl.
*C09D 11/00* (2006.01)

(52) U.S. Cl. .............. 106/31.6; 106/31.65; 106/31.75

(58) Field of Classification Search .............. 106/31.6, 106/31.65, 31.75
See application file for complete search history.

(56) References Cited

U.S. PATENT DOCUMENTS

| 5,147,841 | A | | 9/1992 | Wilcoxon |
| 5,281,635 | A | * | 1/1994 | Bishop ................ 524/93 |
| 5,401,535 | A | * | 3/1995 | Bishop ................ 427/229 |
| 5,743,946 | A | * | 4/1998 | Aoki et al. ............ 106/31.95 |
| 6,616,741 | B1 | | 9/2003 | Sawa et al. |

FOREIGN PATENT DOCUMENTS

| CN | 1 077 471 | 10/1993 |
| CN | 1 078 241 | 11/1993 |
| DE | 10 030 637 | 1/2002 |
| EP | 1 072 653 A2 | 1/2001 |
| EP | 1 238 946 | 9/2002 |
| EP | 1 359 199 A1 | 11/2003 |
| JP | 59170167 | 9/1984 |
| JP | 63293107 | 11/1988 |
| JP | 4342776 | 11/1992 |
| JP | 2001019872 | 1/2001 |
| JP | 2001089140 | 4/2001 |
| JP | 2002069328 | 3/2002 |
| JP | 2003020420 | 1/2003 |
| JP | 2004-067931 A | 3/2004 |
| KR | 9400999 | 2/1994 |
| PL | 177180 B | 10/1999 |
| TW | 421639 | 2/2001 |
| WO | WO 02/41826 A2 | 5/2002 |

OTHER PUBLICATIONS

Kamat, P.V., J. Phys. Chem. B, 106 pp. 7729-7744 (2002) "Photophysical, Photochemical and Photocatalytic Aspects of Metal Nanoparticles", no month available.
Poulikakos, D., et al., Bulletin ETH Zurich No. 292, pp. 53-56 (Feb. 2004) "Goldrausch Aus Dem Tintenstrahldrucker".
Thomas, K.G., et al., Langmuir, 18 pp. 3722-3727 (2002) "Surface Binding Properties of Tetraoctylammonium Bromide-Capped Gold Nanoparticles", no month available.
Bishop, Dr. Peter, "Synthetic and Film Forming Aspects of Precious Metal Nanoparticles", *Proceedings of the Fourth BCC Conference on Fine, Ultrafine, and Nano Particles 2001*, Section 7-C, p. 191.
Gittins, D.I., et al., Angew. Chem. 113, Nr. 16, pp. 3089-3092 (2001) "Spontaner Phasentransfer Metallischer Nanopartikel von der Organischen in die wassrige Phase", no month available.
Goia, D.V., et al., Colloids and Surfaces A: Physiochem. Eng. Aspects 146, pp. 139-152 (1999) "Tailoring the Particle Size of Monodispersed Colloidal Gold", no month available.
Handley, Dean A., Colloidal Gold: Principles, Methods, and Applications, vol. 1, pp. 13-30 (1989) "Methods for Synthesis of Colloidal Gold", no month available.
Bieri, N.R., et al., Appl. Phys. Lett., vol. 82, No. 20, pp. 3529-3531 (May 19, 2003) "Microstructuring By Printing and Laser Curing of Nanoparticle Solutions".
Bonnemann, H., et al., Agew. Chem. Int. Ed. Engl. 30, No. 10, pp. 1312-1314 (1991) "Formation of Colloidal Transition Metals in Organic Phases and Their Application in Catalysis", no month available.
Brust, M., et al., J. Chem. Soc., Chem. Commun., pp. 801-802 (1994) "Synthesis of Thiol-derivatised Gold Nanoparticles in a Two-phase Liquid-Liquid System", no month available.

* cited by examiner

*Primary Examiner*—J. A. Lorengo
*Assistant Examiner*—Veronica Faison-Gee

(57) ABSTRACT

The present invention relates to an aqueous colloidal gold solution, comprising
(a) nano-particular gold particles,
(b) a compound having a polar tertiary amino group conjugated via a hydrophobic aromatic residue with a weaker alkaline group, and
(c) a stabilizer comprising a mercapto group (—SH) and an acidic group, in particular a sulfonic acid group ($-SO_3^-$).

This gold solution uses an ecologically compatible medium and is suited in an especial manner for writing and for printing, also for inkjet printers, since it has a long-term storage life and generates an attractive metal-like gold sheen.

17 Claims, No Drawings

WRITABLE AND PRINTABLE COLLOIDAL GOLD SOLUTION

The present invention pertains to a writable and printable colloidal gold solution which is characterized by its stability and, after application thereof onto a substrate, by its gold-metallic sheen.

PRIOR ART

Stable colloidal gold solutions are of great interest for various applications. Thus, for instance, the application of "liquid gold" can be found in the literature for the production of cosmetic pigments (KR-A-9400999), or aqueous products which contain ultra-fine gold particles and have, assertedly, an excellent physiological activity (EP-A-1238946). One example for the application of gold particles in the catalyst area is described in DE-A-10 030 637.

Due to the "quality rating" of gold inks, there is great demand for writing utensils such as fountain pens or ball-point pens. However, gold inks can equally also be used for printing, such as in inkjet printers, for the repair of gold-plated objects, for the production of electrically conductive layers, for security markings or for the application of catalytically effective layers.

Due to costs, various attempts have been made to produce inks free of gold having a gold-metallic sheen effect for writing and printing. Such "gold inks" commercially available often contain brass or bronze particles (JP-A-2001/019872 and JP-A-43 427 776). Further, a pigment is known from CN 1078241 having a gold-like sheen which is attained by coating a flaky material (e.g. glimmer) with titanium dioxide and rare earth dioxides.

Such, false "gold inks", however, seldom have the desired gold-metallic effect.

It is further known that fine gold particles per se, in other words without dispergators or stabilizers, are not dispersible in aqueous systems. Thus, various techniques are known from the literature for the stabilization of fine gold particles in the production of gold inks and gold-containing coating solutions. JP-A-2001/089140 describes, for example, the stabilization by means of thia-crown-ether compounds with a thiol group or a disulfide binding group in the ring. A coating solution is known from JP-A-2003/02420 which is obtained by addition of a sulfur compound with a mercapto group, a sulfide group or a disulfide group and a reducing agent to a solution which contains chloroauric acid or a salt thereof. There are furthermore proposals to increase the dispersablility of gold pigments by the addition of methyl hydrochloric polysiloxane and amino-modified silicon oil (JP-A-59/170167), amino silane (IW-A-421639, published on Feb. 11, 2001) or natural pigments and an alginate (JP-A-2002/069328).

The production of a violet pigment on the bass of colloidal gold is the subject matter of PL 177180B.

D. Poulikakos and C. P. Grigoropoulus further refer in an article ("Goldrausch aus dem Tintenstrahldrucker" [Gold Rush from the Inkjet Printer] as published in the bulletin of the ETH Zurich, No. 292, February 2004, pp. 54 to 56) to a nano-ink consisting of gold nanoparticles and toluene as carrier liquid (Bieri et al., *Applied Physics Letters, Vol.* 82, p. 3529, 2003) and possible fields of use for micro- and nanostructures of gold in electronic components such as circuit boards, compensators and microchips.

Further, CN 1077471 discloses an ink which consists of two parts, i.e. an aromatic adhesive and gold and silver ink.

However, the following problems often arise with known gold-containing inks and coating solutions. Thus, often undesired interactions are observed between stabilizers or dispergators and the colloidal gold particles which have a negative effect on the metal-like gold effect. Furthermore, many gold inks are not suited for use in inkjet printers since the ink either tends to clog up the supply channels, which may be caused by the aggregation of particles or due to the particle size being too large, or because the inks do not have sufficient stability under printing conditions, in particular at the higher temperatures prevalent in the printer or during printing. Also many inks do not show sufficient long-term stability which is apparent by the precipitation of the gold particles. Finally, inks on the basis of organic media, such as toluene, are not desired for environmental reasons and in view of their behavior during printing in inkjet printers.

An earlier application of the present applicant, WO 02/41826, deals with stable ink substances on a water basis which are also provided for inkjet printing and can contain colloidal gold particles. These aqueous colloidal gold solutions are produced in a phase-transfer process which includes 1. the synthesis of colloidal gold particles in an organic solvent, such as toluene,
2. the phase transfer from the organic phase into the aqueous solution by means of the phase-transfer catalyst 4-dimethylaminopyridine (DMAP).

The aqueous colloidal gold solutions produced in this manner can be easily used as gold inks and the resulting appearance of the writing shows a gold-metallic effect. However, at the concentrations needed for a clearer effect, those colloidal gold solutions obtained according to WO 02/41826 do not have a long shelf-life.

OBJECT OF THE PRESENT INVENTION

The technical object of the present invention thus consisted in providing a writable and printable colloidal gold solution which inter alia
- uses environmentally compatible media,
- has a long shelf-life,
- results in a written or printed image having an excellent gold-metallic sheen, and
- can especially be used also in inkjet printers.

Further objects are revealed by the following description.

SHORT DESCRIPTION OF THE INVENTION

These objects are solved by an aqueous colloidal gold solution comprising:
(a) nano-particular gold particles
(b) a compound having a polar tertiary amino group conjugated via a hydrophobic aromatic residue with a weaker alkaline group which can also be a part of the aromatic residue, and
(c) a stabilizer comprising a mercapto group (—SH) and an acidic group;
and further by additional subject matters defined in the claims.

DETAILED DESCRIPTION OF THE INVENTION

The aqueous colloidal gold solution according to the invention shows excellent storage stability. To test the storage capability, the aqueous colloidal gold solution according to one embodiment of the invention can be stored for three months at 55° C. without it clouding or that even gold particles precipitate. Contrary thereto, the gold ink obtained according to WO 02/41826 is stable at 55° C. for about one day The ecological compatibility of the colloidal gold solution according to the invention is promoted by the use of water as its main medium (on weight basis). Even if it is possible according to the invention to add small amounts of completely water-miscible, environmentally compatible solvents, such as ethanol or isopropanol, to the cold solution, this is not preferred in view of the volatility of most alcoholic solvents. The water content thus amounts preferably to at least 90% by weight, preferably at least to 95% by weight, in particular to 100% by weight, based on all solvent components (not including the water-miscible component (d)). In order to minimize interfering interactions with any ions present, distilled or de-ionized water is preferably used for the aqueous medium.

The expression "colloidal" pertains usually to a dispersion of solid particles having a diameter of approximately 1 to 100 nm in a liquid medium and is also used as such according to the invention. In view of the metal-like gold effect desired and the stability of the colloidal gold solution, however, average particle sizes of 1 to 20 nm are preferred. 1 to 15 nm, in particular 2 to 10 nm, especially 3 to 8 nm are more preferred. The term diameter pertains as regards the typically spherical gold particles when the spherical shape is deviated from, to the in the art, preferably by analytic ultra-centrifugation at 20° C. Alternative and also suitable processes are the transmission electron microscopy (TEM) or measurements of the absorption spectrum in view of the change, depending on size, of the color of the gold particles (as regards measurement, see also WO 02/41826 and D. I. Gittins and F. Caruso: "*Spontaner Phasentransfer metallischer Nanopartikel von der organischen Phase in die wässrige Phase*" [Spontaneous phase transfer of metallic nanoparticles from the organic phase into the aqueous phase], Angew. Chemie, 2001, 113, No. 16, pp. 3089 to 3092, the disclosure of which is incorporated herein by reference).

The gold particles can be produced according to any process suited for a synthesis of cold particles with these average diameters on the nanometer scale. Irrespective of the processes already discussed, the following processes come under particular consideration here: the process according to M. Brust at al., J. Chem. Soc. Commun. 1994, 801–802; as well as the Wilcoxon-AOT process according to U.S. Pat. No. 5,147,841 and the processes according to Hayat, M. A. (ed.) "Colloidal Gold, Principles, Methods and Application" (Academic Press Inc., New York, USA, 1989); Goia, D. V. & Matijevic, E., "Tailoring the Particle Size of Mono-dispersed Colloidal Gold", Colloids Surf. A 146, 139–152, 1999; and the process quoted by D. I. Gittins und F. Caruso by H. Bönnemann et al. in Angew. Chemie., 1991, 103, 1344 and Angew. Chem. Int. Ed. Engl., 1991, 30, 1312; the disclosures of which are incorporated herein by reference.

These processes result in a colloidal gold solution in an organic solvent which must then, as will be explained below, be transferred into an aqueous system.

The compound (b) of the aqueous colloidal gold solution has a polar, tertiary amino group in conjugation with a weaker alkaline group. The term "polar" refers to the capacity of the tertiary amino group (an amino group having three substituents) to impart to gold particles stabilized by compound (b) water-solubility as explained in further detail below. According to WO 02/41826, this compound is used as phase-transfer catalyst. The hydrophobic residue of this phase-transfer catalyst imparts to the molecule solubility in organic media. As FIG. 1 of WO 02/41826 shows, it is presumably the free electron pair of the weaker alkaline group which binds to the gold nanoparticle, then generates via a mesomeric charge displacement a positive charge on the tertiary amino group and promotes by this means the water solubility of the gold nanoparticle. The expression "in conjugation" thus means that the alkaline, tertiary amino group and the alkaline group weaker compared thereto are connected with each other via a de-localized π-electron system. One standard for the alkalinity of the groups is their $pK_B$ values in water at 20° C.

The weaker alkaline group can be any negative, polarizable alkaline group with a free electron pair, which is capable of binding to gold nanoparticles. It is preferably a nitrogen atom integrated into an aromatic system, with aromatic N-hetero-monocycles such as pyridine being preferred. The tertiary amino group binds on the one hand to the hydrophobic residue connected with the weaker alkaline group or containing this, preferably at the already mentioned N-hetero-monocycle, such as pyridine. The two other substituents of the tertiary amino group can be freely selected as long as they do not impair the polarity and water solubility of the group. Preferred substituents stabilize by inductive effects the positive charge on the nitrogen of the tertiary amino group. These include short alkyl chains such as methyl. The most preferred embodiment of the compound (b) is thus 4-dimethyl-aminopyridine (DMAP).

The compound (c) present in the gold solution according to the invention is a stabilizer having a mercapto group (—SH) and an acid function, e.g. a sulfonic acid group (—$SO_3^-$) or a carboxy function, with the sulfonic acid group being preferred. From a chemical point of view, there are no special restrictions as to how the mercapto- and acid groups are to be covalently bound to each other. However, tests with various stabilizers indicate that long-chain compounds reduce the metal-like gold effect and can cause in extreme cases a black appearance when written. Therefore, the molecular weight of the stabilizer (c) should preferably not be more then 200, in particular not more than 185 (not including the proton or cation bound to the acid group). Preferably the mercapto group and the acid group are positioned at the opposite ends of the organic groups binding them (e.g. ($C_{1-5}$)-alkyl). The stabilizer (c) is preferably a mercapto-($C_{1-5}$)-alkylsulfonic acid salt. It is possible to use the stabilizer in the form of the corresponding acid, in particular sulfonic acid, even if then preferably an adjustment to the alkaline pH value takes place. Typically, the stabilizer is used, however, as a salt compound in which the counter-ion is freely selectable as long as it does not interfere with the solubility of the stabilizer in the aqueous systems. The counter-ion can be selected e.g. from alkali metal ions (in particular sodium or potassium), ammonium ions or organic onium compounds, such as quaternary ammonium compounds. Preferably the alkali metal salt is used, in particular the sodium or potassium salt.

According to a preferred embodiment, the aqueous colloidal gold solution according to the invention contains furthermore an evaporation blocker (d), which is selected from polar, organic compounds (polyols) with a vicinal (adjacent) dihydroxy group, such as ethylene glycol, propylene glycol or glycerin and their oligomers. Preferably, the molecular weight of the evaporation blocker is 400 or less, more preferred less than 200 and even more preferred less than 150, in particular less than 100. The use of ethylene glycol is preferred.

It has been surprisingly found that the compound (d), in particular ethylene glycol, not only effectively suppresses the evaporation of the aqueous medium, but in addition contributes in a special manner to the sheen.

The aqueous colloidal gold solution according to the invention comprises preferably the following composition:
- (a) 6 to 10% by weight, in particular 8–10% by weight, of the gold nanoparticles,
- (b) 0.1 to 3% by weight, in particular 0.5–1.5% by weight, of the compound with a tertiary amino group,
- (c) 0.2 to 0.6% by weight, in particular 0.3–0.5% by weight, of the stabilizer, and optionally
- (d) 1 to 8% by weight, in particular 0.3–5% by weight, of the evaporation blocker, each based on the total weight of the aqueous composition.

In order to attain the effects according to the invention, it is not absolutely necessary to use the compound (b). Thus, gold solutions having a long-term storage life and showing a good metal-like gold effect are also obtained with aqueous colloidal gold solutions containing gold nanoparticles and stabilizer (c) in the amounts given above. It is, however, also necessary for this purpose to adjust the pH value to relatively alkaline or acidic values. The latter is not desired in view of acid corrosion of paper when used for writing and printing. This may, however, be tolerable for other applications. The pH of the aqueous colloidal gold solution according to the invention lies preferably in the alkaline range, in particular in the range of pH 8 to 11, especially 9 to 10 (e.g. 9.5).

As can be recognized from the weight ratios given for the components (b) and (c), it is preferred to use the stabilizer (c) in molar amounts which are less than the phase-transfer catalyst (b). It is to be ensured thereby that the stabilizer (c), bound presumably more strongly via the thiol group to the gold nanoparticles, does not completely displace the phase-transfer catalyst (b) from the surface of the gold nanoparticles. Thus, there is the speculation that both compounds contribute to stabilization of the gold nanoparticles. However, the applicant does not want to be bound by these theoretical considerations.

The colloidal gold solution according to the invention can furthermore contain, depending on where it will be used and the requirements therefore, common ink additives in the usual amounts such as described in EP-A1-1 359 199 or EP-A2-1 072 653, e.g.
- compounds for the alteration of the surface tension, e.g. alkyl- or aryldiol-ether, such as described in paragraph [0028] of EP-A1-1 359 199, or the $C_{1-6}$ alkyl ether described in EP-A2-1 072 653 of an α-hydroxy carboxylic acid (see paragraph [0019]), in particular in combination with a $C_{3-8}$ alkanol, with 2 to 4 hydroxy groups which influence the penetration capability of the ink into the paper;
- low-boiling solvents, e.g. as described in paragraph [0042] of EP-A1-1 359 199 which promote the drying of the ink;
- other glycols than compound (d), which can also contribute to the ink not drying at the nozzles of a printer;
- anti-oxidation means, surfactants, water-soluble polymers, buffer substances, biocides, standardizing agents and other common auxiliary agents, as long as theses do not have a negative effect on the stability of the gold solution according to the invention and the gold-metal sheen generated.

It was, however, surprisingly found that the ink according to the invention does not require, in particular with a relatively high gold content of 8 to 10% by weight, any special measures to adjust the surface tension and can be universally used on all kinds of papers, including glazed paper. One decisive advantage of the gold solution according to the invention is thus also that such ink additives as mentioned above and other common auxiliary agents can be dispensed with.

When synthesizing the colloidal gold solution according to the invention, a phase transfer can be performed in a first step with the compound (b), in particular DMAP, as is described in WO 02/41826. The stabilizer (c) and optionally the evaporation blocker (d) and further optional components are then added to the resulting aqueous phase. However, this method makes an exact dosage of the gold nanoparticles difficult. It is therefore preferred to produce the gold nanoparticles, according to a process known in the art, in the organic phase, preferably in an aromatic solvent such as toluene, and to then precipitate them from the organic phase by addition of the compound (b), in particular DMAP. The gold nanoparticles obtained in this manner are then preferably dried in the vacuum and are thereafter freely dispersible in water. The aqueous colloidal gold solution according to the invention which can be used in this form directly for writing, printing or coating substrates is obtained by dissolving in water the gold nanoparticles, obtained in this manner and stabilized via the compound (b), and the stabilizer (c), optionally by adding the evaporation blocker (d).

The colloidal gold solution according to the invention produces gold surfaces having a metallic effect and with an excellent sheen and an attractive gold tone. The colloidal gold solution moreover offers all of the preconditions for a permanent ink showing fastness on documents. Furthermore, the colloidal gold solution is advantageous from an environmental point of view since it is based on aqueous medium.

The colloidal gold solution according to the invention can be applied in many different ways. It can be effectively used wherever colloidal gold solutions are already in use (see also the discussion of the prior art). The following applications are of especial interest:
- The ink to be protected can be used as ink for all kinds of fountain pens, i.e. as ink in pots or in cartridges. Ball point pens, felt-tip pens, spray cans, etc. are naturally also imaginable.
- The ink can be applied by stamps.
- The ink can be used for drawing/painting or other decorative applications (also on wood or metal).
- The ink can be used for the repair of gilded objects (e.g. dials on clocks).
- It is, however, preferred when applying the ink to metal or glass surfaces that the gold layer generated is coated with a clear lacquer or another transparent protective layer so as to reduce the potential for wear by abrasion.
- The ink can be printed with ink-jet processes.
- The ink can be used for the production of conductive layers.
- The ink can be used as a security marker.
- The ink can be used for the application of catalytically effective layers.

The colloidal gold solution according to the invention is filled preferably into ink or printer cartridges for writing or printing. The present invention is, due to the excellent suitability for inkjet printing processes, directed in addition also to conventional inkjet printer cartridges containing the gold solution.

The subject matter of the present invention is furthermore substrates coated with gold which can be obtained by an application of the colloidal gold solution onto a substrate and the evaporation of the solvent(s). The gold layers produced in this manner are characterized not only by the metal-like sheen and the attractive gold tone, but also by their excellent long-term storage capability. This is true in particular for substrates such as papers, furniture, metal and glass surfaces, etc., where the decorative effect of the gold layer according to the invention is apparent. However, the present invention is equally useful when catalyst particles are to be coated with gold (impregnated) or in the production of circuit boards for electronic components where, if necessary, there is a subsequent heat treatment, e.g. a sintering treatment, for an increase of stability.

The invention will now be explained in more detail by examples.

REFERENCE EXAMPLE 1

Synthesis of the Gold Nanoparticles 8.1 mmole % (3.1896 g) tetra-chloroauric-acid trihydrate is dissolved in a 2-liter stirrer vessel in 270 ml water. Parallel thereto, 18 nmole (9.8426 g) tetra-n-octylammonium bromide (TOABr) is dissolved in 720 ml toluene. The dissolved TOABr is then added under a $N_2$ flow during stirring quickly to the tetra-chloroauric-acid solution. The toluene phase is immediately dyed red and the water phase is clear. The reaction charge is then stirred for five minutes under $N_2$. During this, 90 mmole $NaBH_4$ is dissolved in 225 ml water. The $NaBH_4$ solution is very quickly added to the mixture under $N_2$ flow and while being greatly stirred. The toluene phase is dyed dark red and the water phase remains colorless. The reaction mixture is then allowed to be strongly stirred for 30 minutes under a continuous $N_2$ flow.

The phase separation then takes place after 30 minutes in a separating funnel, where the aqueous, clear phase is discarded. The dark red toluene phase is now extracted by shaking or washed once with 90 ml 0.1 moleric $H_2SO_4$, thereafter once with 90 ml 0.1 moleric NaOH and thrice with 90 ml each $H_2O$ in the separating funnel. The toluene phase is halved and filled into two 750 ml centrifugal vessels of polypropylene (PP). In each centrifugal vessel 20 mmole (2.45 g) 4-dimethyl-amino pyridine (DMAP) is added for the precipitation of the nanoparticles and this is stirred for one hour. Thereafter, the precipitated gold nanoparticles are centrifuged for 15 minutes at 4350 r/min and the almost clear toluene is discarded. The last residue of toluene is suctioned off with a pipette. The gold nanoparticles stabilized with 4-dimethyl amino pyridine are dried in the dynamic vacuum and are thereafter freely dispersable in water.

The following is to be noted regarding the various parameters when synthesizing gold:

Yields:

The yields vary depending on various parameters such as stoichiometry, rate of addition of the hydro boron solution, material and surface quality of the precipitating vessel. An average yield lies at approximately 70%. The remaining gold is, however, reclaimed in the form of larger agglomerates from the washing water containing sodium hydroborate.

4-DMAP:

Five times the amount of DMAP is used as the standard in order to guarantee sufficient stabilization. A lesser amount should not be used and greater amounts of DMAP, however, cause no improvement in yield or changes in the particle properties.

$NaBH_4$:

Also, up to 45 mmole can be used instead of 90 mmole, however, the yield is reduced to 45%.

TOABr:

Up to 9 mmole tetra-octyl-ammonium bromide can also be used. The yield decreases somewhat since the phase transfer of the gold ions into the organic phase is somewhat impeded. An increase of the amount does not cause any improvement.

Reaction Time:

The reaction time can be varied from approximately 20 minutes to several hours. The best lies at approximately 30 to 60 minutes.

Concentration:

The charge can be concentrated at a maximum of up to double the concentration, lesser dilutions cause a worse separation of the particles.

Without $N_2$, a worse yield is obtained.

EXAMPLE 1

Production of the Gold Ink

In a 30 ml centrifugal vessel (material polypropylene (PP)) 19.2 ml $H_2O$ (distilled) is combined with 0.8 ml ethylene glycol and thereafter 80.3 mg 2-mercaptoethane sulfonic acid sodium salt is added. At room temperature 2.236 g 4-dimethyl amino pyridine-stabilized gold nanoparticles (produced as in Reference Example 1) are added to the solution and the mixture is heftily shaken for 5 minutes. In order to remove a possible precipitation the charge is centrifuged for a maximum of 2 minutes at 1800 rotations per minute. By decanting the supernatent, almost 20 ml of gold ink is obtained.

The ink obtained in this manner is storage-stable at 55° C. for at least 3 months. It produces on white writing paper a written appearance having a very good metal-like sheen and a very attractive gold tone. First tests prove furthermore that this ink is suited without problem also for inkjet printers.

EXAMPLE 2

When 2-mercapto-ethane-sulfonic acid sodium salt is replaced in Example 1 by 11-mercapto undecanoic acid, 3-mercapto propionic acid, DL-mercapto succinic acid, or thio-glycol acid, it has been found that this causes the gold particles to also stabilize and leads to a gold-like appearance when written. The stabilizing effect is, however, less. A decrease of the gold-sheen effect is in part furthermore observed. For example, with the use of 11-mercapto undecanoic acid, the appearance of the writing is darkened. (With carboxylic acids, a pH value of >9 is adjusted here in order to deprotonate the carboxylic acid function and to obtain solubility in water. NaOH, ethanol amine, pyrrolidon, or tris-(hydroxymethyl)-amine methane are used as base).

COMPARATIVE EXAMPLE 1

If 2-mercapto-ethane-sulfonic-acid sodium salt is replaced in Example 1 by mercapto-propyl-(trimethoxy)-silan, a satisfactory stabilization is not obtained, nor is a satisfactory gold-sheen effect obtained.

COMPARATIVE EXAMPLE 2

If the phase-transfer catalyst DMAP is replaced in Reference Example 1 by 11-mercapto undecanoic acid in order to stabilize the gold particles at the same time in this manner, it is found that the particles dissolve only at very high pH values of more than 11, which is not desired.

COMPARATIVE EXAMPLE 3

If the phase-transfer catalyst DMAP is replaced in Reference Example 1 by 2-mercapto-ethane-sulfonic acid in order to stabilize the gold particles at the same time in this manner, it is found that the particles dissolve only at very low pH values of less than 3, which is not desired for inks.

The invention claimed is:

1. An aqueous colloidal gold solution comprising an aqueous medium and
   (a) gold particles in colloidal form,
   (b) a compound having a polar tertiary amino group conjugated via a hydrophobic aromatic residue with a weaker alkaline group which can also be a part of the aromatic residue, and
   (c) a stabilizer comprising a mercapto group (—SH) and an acidic group,
   wherein said solution has a gold content of 8 to 10% by weight.

2. An aqueous colloidal gold solution according to claim 1, wherein the colloidal gold particles have an average diameter of 1 to 20 nm.

3. An aqueous colloidal gold solution according to claim 1 or 2, wherein the aromatic residue of the compound (b) is a N-heteroaromatic residue with the nitrogen atom as weaker alkaline group.

4. An aqueous colloidal gold solution according to claim 3, wherein the heteroaromatic residue is a pyridine residue.

5. An aqueous colloidal gold solution according to claim 4, wherein the compound (b) is 4-dimethylamino-pyridine (DMAP).

6. An aqueous colloidal gold solution according to claim 1, wherein the stabilizer (c) comprises a sulfonic acid group ($-SO_3^-$).

7. An aqueous colloidal gold solution according to claim 6, wherein the stabilizer (c) is a mercapto-($C_{1-5}$)-alkylsulfonic acid salt.

8. An aqueous colloidal gold solution according to claim 7, wherein the stabilizer (c) is a 2-mercaptoethane sulfonic acid salt.

9. An aqueous colloidal gold solution according to claim 1, comprising furthermore, as evaporation blocker,
   (d) a polar organic compound with a vicinal dihydroxy group or an oligomer thereof.

10. An aqueous colloidal gold solution according to claim 9, wherein the compound (d) is ethylene glycol.

11. An aqueous colloidal gold solution according to claim 1, having the following composition:
    (a) 8 to 10% by weight of the gold nanoparticles,
    (b) 0.1 to 3% by weight of the compound having a tertiary amino group,
    (c) 0.2 to 0.6% by weight of the stabilizer, and optionally
    (d) 1 to 8% by weight of the evaporation blocker, each based on the total weight of the aqeous compostion.

12. An aqueous colloidal gold solution according to claim 1, having a pH of 8 to 11.

13. Ink or printer cartridges containing the aqueous colloidal gold solution of claim 1.

14. Printer cartridge according to claim 13, which is an ink jet printer cartridge.

15. An aqueous colloidal gold solution according to claim 6, comprising furthermore, as evaporation blocker,
    (e) a polar organic compound with a vicinal dihydroxy group or an oligomer thereof.

16. Ink or printer cartridges containing the aqueous colloidal gold solution of claim 6.

17. Ink or printer cartridges containing the aqueous colloidal gold solution of claim 11.

* * * * *